United States Patent [19]

Ipri et al.

[11] 4,050,965

[45] Sept. 27, 1977

[54] SIMULTANEOUS FABRICATION OF CMOS TRANSISTORS AND BIPOLAR DEVICES

[75] Inventors: Alfred C. Ipri, Princeton, N.J.; John C. Sarace, Mission Viejo, Calif.

[73] Assignee: The United States of America as represented by the Secretary of the Air Force, Washington, D.C.

[21] Appl. No.: 624,515

[22] Filed: Oct. 21, 1975

[51] Int. Cl.² .................... H01L 21/84; H01L 21/265
[52] U.S. Cl. ........................................ 148/175; 29/571; 29/578; 148/1.5; 148/187; 357/4; 357/23; 357/35; 357/49; 357/53; 357/91
[58] Field of Search .................. 148/1.5, 175, 187; 357/23, 49, 53, 91, 4, 35; 29/571, 578

[56] References Cited

U.S. PATENT DOCUMENTS

| | | | |
|---|---|---|---|
| 3,411,051 | 11/1968 | Kilby | 148/187 X |
| 3,660,732 | 5/1972 | Allison | 357/23 X |
| 3,739,238 | 6/1973 | Hara | 357/4 X |
| 3,749,614 | 7/1973 | Boleky et al. | 148/175 X |
| 3,837,071 | 9/1974 | Ronen | 29/571 |
| 3,845,495 | 10/1974 | Cauge et al. | 357/23 |
| 3,895,390 | 7/1975 | Meiling et al. | 357/23 |
| 3,926,694 | 12/1975 | Cauge et al. | 148/187 |
| 3,933,529 | 1/1976 | Goser | 148/1.5 |

OTHER PUBLICATIONS

Zuleeg, R., "Silicon-on-Sapphire ... IC's", Electronics, Mar. 20, 1967, pp. 106–108.
Zuleeg et al., "Thin-film Lateral Bipolar... Structure" Electronics Letters, vol. 3, No. 4, Apr. 1967, pp. 137–139.

Primary Examiner—L. Dewayne Rutledge
Assistant Examiner—W. G. Saba
Attorney, Agent, or Firm—Joseph E. Rusz; George Fine

[57] ABSTRACT

A process for the simultaneous fabrication of CMOS transistors and bipolar devices on the same integrated circuit. The process follows the standard Silicon-Gate Deep Depletion technology up through gate definition. An additional mask step is included for definition of the base implant region. After the base diffusion the process again follows the standard approach resulting in a new structure which permits the fabrication of CMOS/SOS as well as a bipolar driver transistor.

1 Claim, 11 Drawing Figures

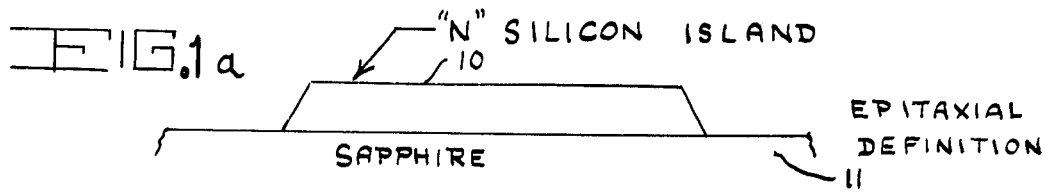
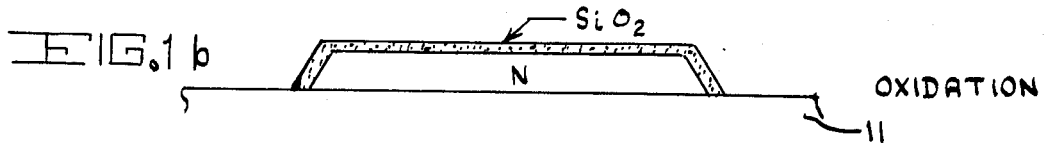
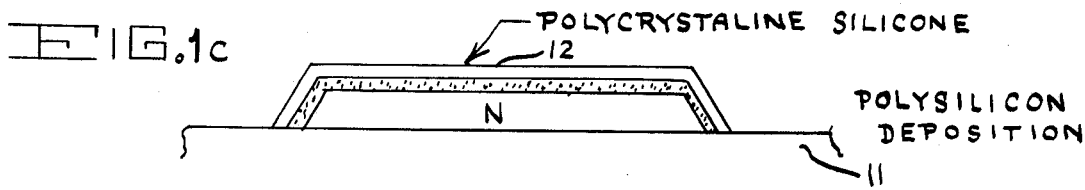
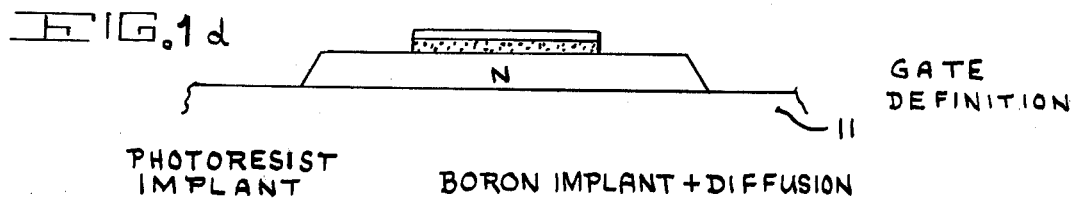
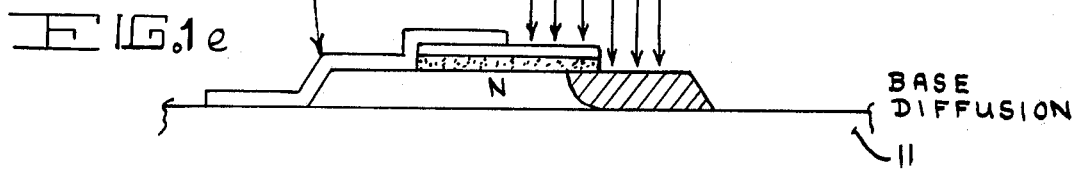
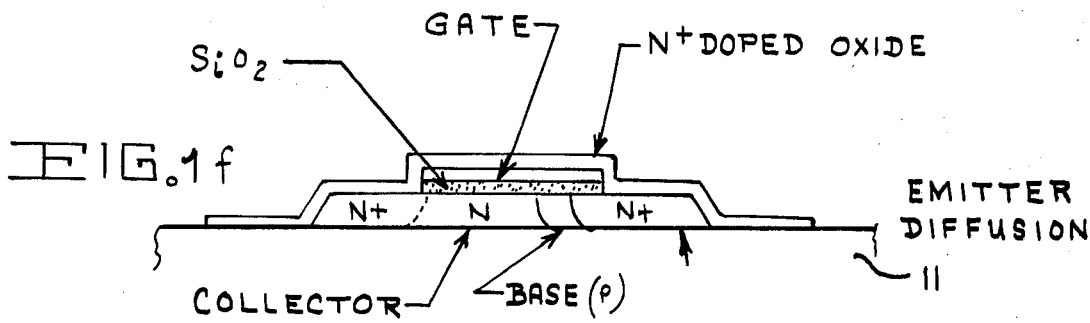
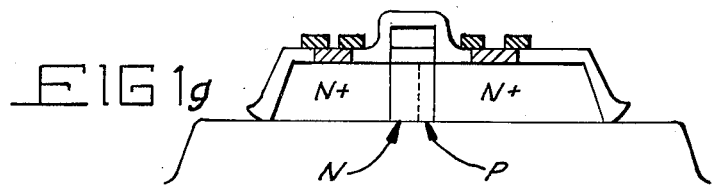

OFF STATE

ON STATE

SIMULTANEOUS FABRICATION OF CMOS TRANSISTORS AND BIPOLAR DEVICES

STATEMENT OF GOVERNMENT INTEREST

The invention described herein may be manufactured and used by or for the Government for governmental purposes without the payment of any royalty thereon.

BACKGROUND OF THE INVENTION

In the prior art, processes permitted forming on the same substrate unipolar and bipolar transistors intended to complement each other in whatever circuit function they performed while retaining their independent characteristics. It also has been possible by other process techniques to fabricate functioning bipolar transistors on SOS. The process, however, was very complex and was not compatible with the fabrication of CMOS devices on the same chip. The bipolar transistors also were not lateral and did not take advantage of the poly-silicon mask as in the present invention.

The present invention provides a process for the simultaneous fabrication of CMOS transistors and bipolar devices on the same integrated circuit. The key point is the use of polysilicon as a diffusion mask edge for both the emitter and base. This permits the fabrication of lateral bipolar devices having narrow base widths (i.e., $W_B < 5000A$) since the base width is determined only by the base and emitter diffusion parameters i.e., concentration time, and temperature) and not by any lateral dimension.

SUMMARY OF THE INVENTION

A process for the manufacture, on the same chip, of CMOS transistors, which are characterized as being unipolar, and NPN or PNP transistors which are bipolar devices. Up to gate definition, the process follows the standard silicon-gate depletion technology. Thus, prior to gate definition the following steps are sequentially executed: (1) epitaxial deposition of silicon onto a sapphire substrate; (2) etching to prepare regions to form (a) "n" and "p" channels for MOS zones, and (b)SOS/MOS bipolar zones, (3) oxidation of the islands, and (4) deposit of poly-crystalline silicon. Continuing with the process, P doping produces the base, N+ doping produces the source drain regions of the N channel unipolar device as well as the emitter of the bipolar device.

DESCRIPTION OF THE DRAWINGS

FIG. 1b illustrates oxidation in the process of manufacture;

FIG. 1a illustrates epitaxial definition in the process of manufacture;

FIG. 1c illustrates poly-silicon deposition;

FIG. 1d illustrates gate definition;

FIG. 1e illustrates base diffusion;

FIG. 1f illustrates emitter diffusion;

FIG. 1g illustrates the layout of the bipolar device; and

DETAILED DESCRIPTION OF THE PREFERRED EMBODIMENT

Described hereinafter is the process for the simultaneous fabrication of CMOS transistors and bipolar devices on the same integrated circuit. FIGS. 1a throgh 1f show the process sequence. In step 1, as illustrated in FIG. 1a, an epitaxial layer of semiconducting material 10 (silicon) is deposited, in a single crystal fashion, on dielectric substrate 11 (sapphire). In step 2, semiconductor islands are next formed by an etching technique leaving regions of material where "n" and "p" channel MOS transistors are to be formed as well as the SOS/MOS bipolar device. In step 3, as illustrated in FIG 1b, the islands are oxidized (or covered with a suitable dielectric). In step 4, as illustrated in FIG. 1c, poly-crystalline silicon 12 (or other high temperature conducting layers) is deposited and defined. FIG. 1d illustrates gate definition. In step 5, the bipolar devices receive a base doping (either standard diffusion sources or ion implantation) in one side of the device, and a diffusion. FIG. 1e illustrates base diffusion. In step 6, the N+ doping for the emitter of the bipolar device is done next (either standard diffusion sources or ion implantation). It should be noted that the "edge" of the poly-silicon gate is the diffusion edge for both the base and emitter diffusion. The N+ doping is also used to make better contact to the collector region as well as for source drain "n" channel device doping. FIG. 1f illustrates emitter diffusion. In step 7, the P+ doping for "p" channel source-drain doping and base contact is next. In step 8, the diffusion sources (N+ and P+) are driven in (or annealed if ion implantation is used). In step 9, contacts are opened and metal interconnects are used to complete the circuit.

The process yields CMOS (SOS transistors as well as a bipolar device. The sequence described is for the fabrication of an NPN but the process is similar for a PNP device.

It is emphasized that the fabrication sequence for a lateral bipolar transistor is shown in FIGS. 1a through 1f. The process follows the standard Silicon-Gate Deep Depletion technology up through gate definition. An additional mask step is included for definition of the base implant region. After the base diffusion, the process again follows the standard approach resulting in a new structure which permits the fabrication of CMOS/SOS as well as a bipolar driver transistor.

FIG. 1g illustrates the layout of the bipolar device.

The key point in the invention is the use of the polysilicon as a diffusion mask edge for both the emitter and base. This permits the fabrication of lateral bipolar devices having extremely narrow base widths (i.e., $W_B < 5000$ A), since the base width is determined only by the base and emitter diffusion parameters (i.e., concentration time, and temperature) and not by any lateral dimensions.

Figure 2A:
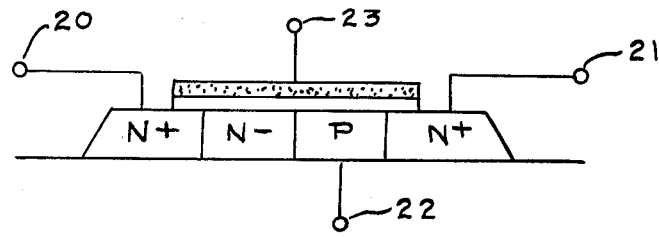
FIGS. 2a through 2d show the operation of the device (SOS bipolar transistor) as an emitter follower.
Figure 2B:
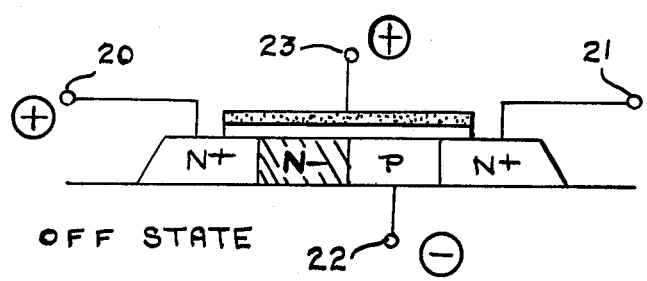
Figure 2C:
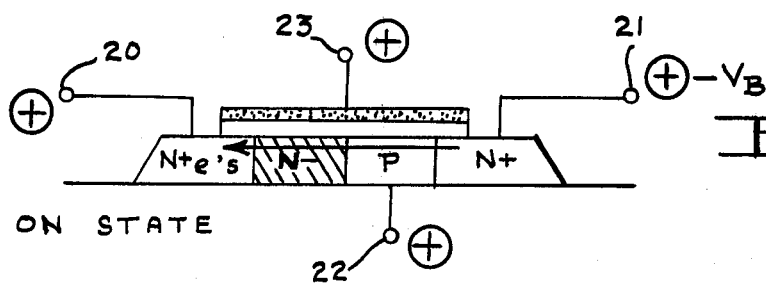
Figure 2D:
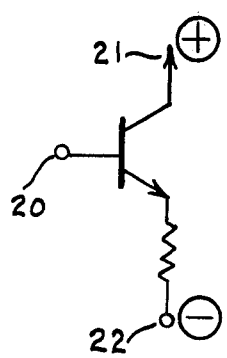

Now referring to FIGS. 2a through 2d, there is shown the operation of the fabricated device as an emitter follower. FIG. 2a shows the fabricated device having collector terminal 20, emitter 21, base terminal 22, and gate 23, and FIG. 2d is a schematic representation thereof. The gate bias can be used to completely deplete the collector region which is low doped as shown in the figure. In the off state shown in FIG. 2b, no current flows across the emitter base functions since they are at the same bias. As the base potential becomes more positive $(V > V_B)$ electrons will be injected into the base from the emitter. These electrons will diffuse across the base and enter the collector depletion region where the field is such that they will be swept through to the collector contact. The emitter voltage increases as the base voltage increases up to a maximum of the base voltage minus the contact potential (i.e., $V_B = 0.7$ V).

FIG. 2c illustrates the on state. There are, of course, other modes of operation but the emitter follower is the simplest in conception and also the most useful from a current handling standpoint.

What is claimed is:

1. A process for the fabrication of a bipolar device being comprised of forming a dielectric substrate of sapphire, depositing an epitaxial layer of semiconducting material thereupon in a single crystal fashion, forming semiconductor islands by an etching technique leaving regions of material where the bipolar device is to be formed, oxidizing the formed semiconductor islands, depositing poly-crystalline silicon thereupon, defining the deposited poly-crystalline silicon, base doping the bipolar device on one side of the device, diffusing the base doping, N+ doping for the emitter of the bipolar device with the edge of the formed poly-silicon gate being the diffusion edge for both the base and emitter diffusion, the N+ doping also making better contact to the collector region, as well as for source-drain n-channel device doping, P+ doping for "p" channel source drain, base contacting, driving in diffusion sources N+ and P+, opening contacts, and forming metal interconnects to complete the circuit.

* * * * *